(12) United States Patent
Liang et al.

(10) Patent No.: US 12,170,214 B2
(45) Date of Patent: Dec. 17, 2024

(54) SEMICONDUCTOR DEVICE MANUFACTURING SYSTEM AND METHOD FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Kai-Chih Liang, Tainan (TW); Yu Kai Chen, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 429 days.

(21) Appl. No.: 17/103,794

(22) Filed: Nov. 24, 2020

(65) Prior Publication Data

US 2022/0165592 A1    May 26, 2022

(51) Int. Cl.
*H01L 21/67* (2006.01)
*G05B 19/418* (2006.01)

(52) U.S. Cl.
CPC ...... *H01L 21/67248* (2013.01); *G05B 19/418* (2013.01); *H01L 21/67103* (2013.01); *G05B 2219/45031* (2013.01)

(58) Field of Classification Search
CPC ........ G05B 19/418; G05B 2219/45031; H01L 21/67248; H01L 21/67103; H01L 21/67017; H01L 21/67253; G05D 22/02; G05D 23/1917; G05D 27/02; F24F 3/1405
See application file for complete search history.

(56) References Cited

U.S. PATENT DOCUMENTS

| 6,168,085 | B1* | 1/2001 | Garcia | G05D 27/02 |
| | | | | 55/385.2 |
| 6,430,944 | B1* | 8/2002 | Ozawa | F25B 49/005 |
| | | | | 236/51 |
| 2006/0039408 | A1* | 2/2006 | Wortel | G06F 13/4282 |
| | | | | 370/470 |
| 2007/0097580 | A1* | 5/2007 | Brillhart | H01L 21/67109 |
| | | | | 361/103 |
| 2010/0219175 | A1* | 9/2010 | Peng | H05B 3/148 |
| | | | | 219/443.1 |

(Continued)

OTHER PUBLICATIONS

이경복, "Substrate Treatment Apparatus Including Supplying Unit for Cooling Gas" (machine translation), Dec. 31, 2009, ip.com machine translation (Year: 2009).*

(Continued)

*Primary Examiner* — Christopher W Carter
(74) *Attorney, Agent, or Firm* — WPAT LAW; Anthony King

(57) ABSTRACT

A semiconductor device manufacturing system and a method for manufacturing semiconductor device are provided. The semiconductor device manufacturing system includes a conditioner connected to a semiconductor device manufacturing apparatus, a data collector connected to the conditioner and a processor connected to the data collector. The conditioner is configured to control a temperature and a humidity of an air and deliver the air to the semiconductor device manufacturing apparatus. The data collector is configured to collect data from the conditioner. The processor is configured to receive the data transferred from the data collector.

20 Claims, 9 Drawing Sheets

(56) References Cited

U.S. PATENT DOCUMENTS

| | | | |
|---|---|---|---|
| 2017/0198953 A1* | 7/2017 | Connell | F25B 43/003 |
| 2018/0233367 A1* | 8/2018 | Farley | H01L 21/67103 |
| 2019/0162436 A1* | 5/2019 | Albinger | F24F 11/89 |
| 2019/0304820 A1* | 10/2019 | Baggett | H01J 37/20 |
| 2020/0356087 A1* | 11/2020 | Elbsat | G05B 23/0254 |
| 2021/0018902 A1* | 1/2021 | Yennie | G06N 3/045 |

OTHER PUBLICATIONS

Chou You-Hua, "Processing System and Processing Method" (machine translation of TW 201905611), Jun. 29, 2017, ip.com machine translation for application TW 201905611A (Year: 2017).*

* cited by examiner

SEMICONDUCTOR DEVICE MANUFACTURING SYSTEM AND METHOD FOR MANUFACTURING SEMICONDUCTOR DEVICE

BACKGROUND

Generally speaking, in a process for manufacturing a semiconductor device, whether it is a process such as film deposition, etching, lithography, diffusion, or heat treatment, in order to achieve a stable yield of manufactured components, the temperature and the humidity of the semiconductor device manufacturing apparatus should be maintained within a specific range such that the manufacturing process could be stable and smooth.

In order maintain the temperature and the humidity of the semiconductor device manufacturing apparatus within a specific range, the user usually monitors the temperature and the humidity of the semiconductor device manufacturing apparatus by the sensor mounted to the semiconductor device manufacturing apparatus. However, once the user finds the temperature and/or the humidity of the semiconductor device manufacturing apparatus is abnormal, it is too late to adjust the temperature and the humidity of the semiconductor device manufacturing apparatus and the workpiece in the semiconductor device manufacturing apparatus has failed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
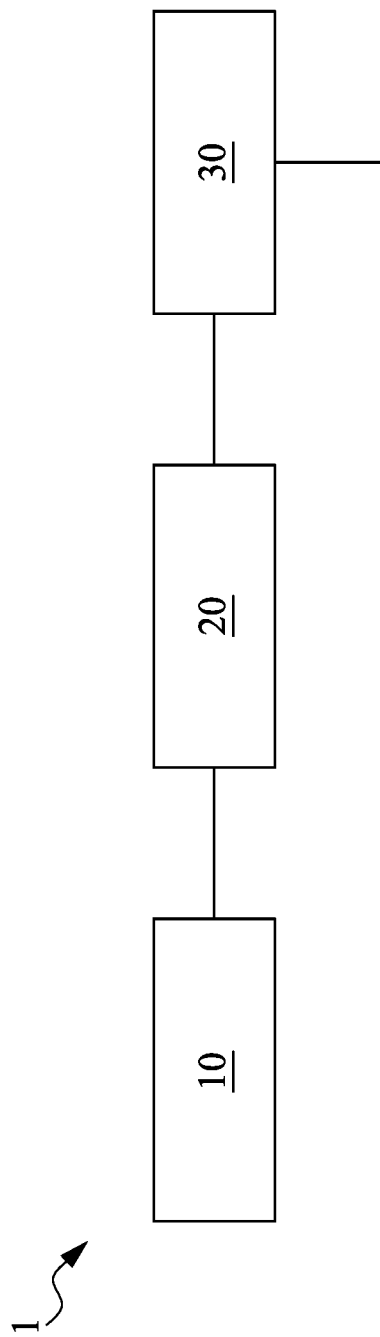
FIG. 1 is a schematic view of a semiconductor device manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

At present, the common practice in the semiconductor manufacturing industry is to connect each semiconductor device manufacturing apparatus with at least one conditioner, and the connected conditioner can adjust the temperature and/or the humidity required by the semiconductor manufacturing process.

Present disclosure provides a semiconductor device manufacturing system that detects the abnormal temperature and/or humidity in the semiconductor device manufacturing apparatus based on the data collected from the conditioner, and the user can adjust and control the temperature and/or humidity in the semiconductor device manufacturing apparatus before the semiconductor device manufacturing apparatus shuts down and/or the workpiece in the semiconductor device manufacturing apparatus fails.

FIG. 1 is a schematic view of a semiconductor device manufacturing system 1 in accordance with some embodiments of the disclosure. In some embodiments of the present disclosure, the semiconductor device manufacturing system 1 includes a semiconductor device manufacturing apparatus 10, a conditioner 20, a data collector 30 and a processor 40.

In some embodiments of the present disclosure, the semiconductor device manufacturing apparatus 10 includes an apparatus that performs at least one step of respective steps for manufacturing a semiconductor device. For example, the semiconductor device manufacturing apparatus 10 can be structured as an apparatus for performing a pattern forming step of a semiconductor device. In the pattern forming step of a semiconductor device, a photoresist material is firstly applied onto a semiconductor substrate, and then the resist material is exposed through a photomask (reticle). When the photoresist material is a positive-type material, an area to be removed in a succeeding development step is exposed. On the other hand, when the photoresist material is a negative-type material, an area to be left in the development step is exposed. Then, an exposed area or an unexposed area in the resist material is removed by a solvent or the like. Thus, a resist pattern having a pattern corresponding to the exposure pattern is formed on the semiconductor substrate. Thereafter, the semiconductor substrate is etched by plasma etching with the resist pattern as a mask. Thus, a semiconductor device having a pattern corresponding to the resist pattern is manufactured.

In the semiconductor device manufacturing step in the semiconductor device manufacturing apparatus 10, a temperature and a humidity of an atmosphere are required to be precisely controlled. Thus, the conditioner 20 which may adjust temperature and humidity is connected to the semiconductor device manufacturing apparatus 10. Air whose temperature and humidity are precisely controlled by the conditioner 20 is delivered to the semiconductor device manufacturing apparatus 10 such that the temperature and humidity are maintained within an appropriate range. In some embodiments of the present disclosure, the conditioner 20 may provide a cooling fluid to a cold plate of the semiconductor device manufacturing apparatus 10.

Referring to FIG. 1, the data collector 30 is connected to the conditioner 20. In some embodiments of the present disclosure, the data collector 30 is configured to receive data/information directly outputted from the conditioner 20. In some embodiments of the present disclosure, the data collect 30 is configured to receive data/information detected and collected in the conditioner 20.

The processor 40 is connected to the data collector 30. The data collector 30 may transfer the data/information to the processor 40. In some embodiments of the present disclosure, the processor 40 is configured to provide the data/information transferred from the data collector 30. In some embodiments of the present disclosure, the processor 40 is configured to analyze the data/information transferred from the data collector 30 and provide the result of analysis of the data/information. The user may further control the conditioner 20 to adjust the temperature and/or humidity in the semiconductor device manufacturing apparatus 10 based on the data/information and/or the result of analysis of the data/information provided from the processor 40. In some embodiments of the present disclosure, the processor comprises a Fault Detection Classification (FDC).

Figure 2:
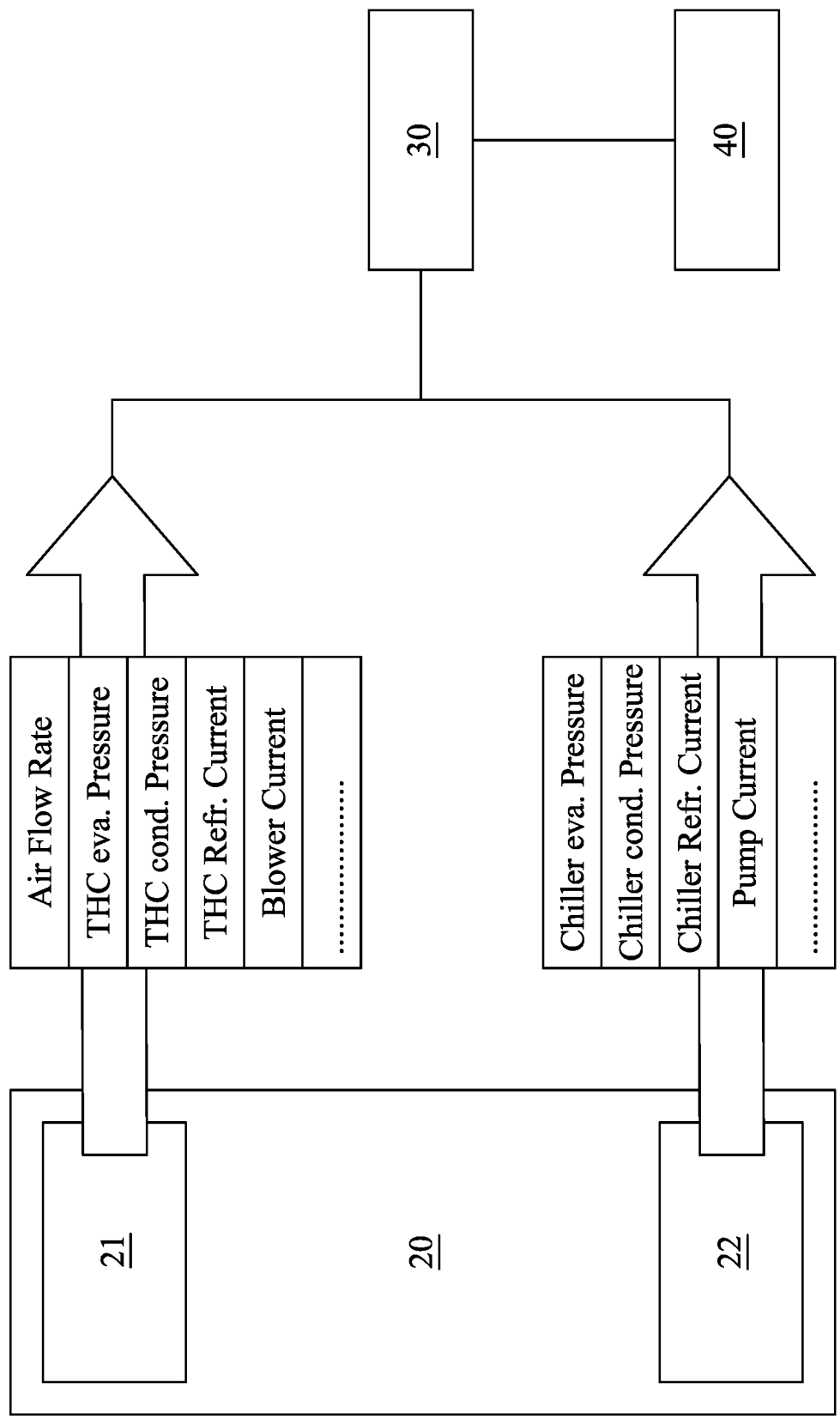
FIG. 2 is a schematic view of a conditioner in accordance with some embodiments of the present disclosure.

FIG. 2 is a schematic view of a conditioner in accordance with some embodiments of the present disclosure. As shown in FIG. 2, in some embodiments of the present disclosure, the conditioner 20 includes a temperature and humidity controller 21. The temperature and humidity controller 21 is configured to control a temperature and a humidity of an air and deliver the air to the semiconductor device manufacturing apparatus 10. That is, the temperature and humidity controller 21 may properly control the temperature and the humidity of the processing air. The air is treated to have a constant temperature and humidity by the temperature and humidity controller 21, and then supplied to the semiconductor device manufacturing apparatus 10. Therefore, the semiconductor device of good quality which satisfies the process conditions can be fabricated.

Moreover, in some embodiments of the present disclosure, the conditioner 20 includes a chiller 22. The chiller 22 is configured to provide a cooling fluid to the semiconductor device manufacturing apparatus 10. The chiller 22 may supply cooling fluid, such as cooling water, to the semiconductor device manufacturing apparatus 10 and circulate through the interior of the semiconductor device manufacturing apparatus 10. That is, cooling fluid is led to the semiconductor device manufacturing apparatus 10 from a cooling-fluid supply line through which the cooling fluid flows, and the cooling fluid which is warmed by absorbing heat from the semiconductor device manufacturing apparatus 10 is returned to a cooling-fluid recovery line. The cooling fluid which returned to the cooling-fluid recovery line is again supplied to a cooling-fluid supply line, after being cooled by the chiller 22.

In some embodiments of the present disclosure, the temperature and humidity controller 21 monitors itself and provides and outputs data and/or information related to the operations of its inner parts. The data and/or information may include the air flow rate, the evaporator pressure, the condenser pressure, the refrigerant flow rate, the blower current of the temperature and humidity controller, etc. In some embodiments of the present disclosure, the chiller 22 monitors itself and provides and outputs data and/or information related to the operations of its inner parts. The data and/or information may include the evaporator pressure, the condenser pressure, the refrigerant flow rate, the pump current, etc. The data and/or information outputted from the temperature and humidity controller 21 and/or the chiller 22 may include binary data. A serial device 31 configured to convert binary data to decimal data may connect the temperature and humidity controller 21 and the chiller 22 and directly receive the data and/or information outputted from the temperature and humidity controller 21 and/or the chiller 22. Further, the serial device 31 converts the binary data from outputted from the temperature and humidity controller 21 and/or the chiller 22 to the decimal data. After the binary data is converted to the decimal data, the serial device 31 may further transfer the decimal data to the processor 40. In some embodiments of the present disclosure, the processor 40 directly provides the data from the serial device 31. In some embodiments of the present disclosure, the processor 40 may analyze the data from the serial device 31 and provides the result of analysis for the user's reference.

Figure 3:
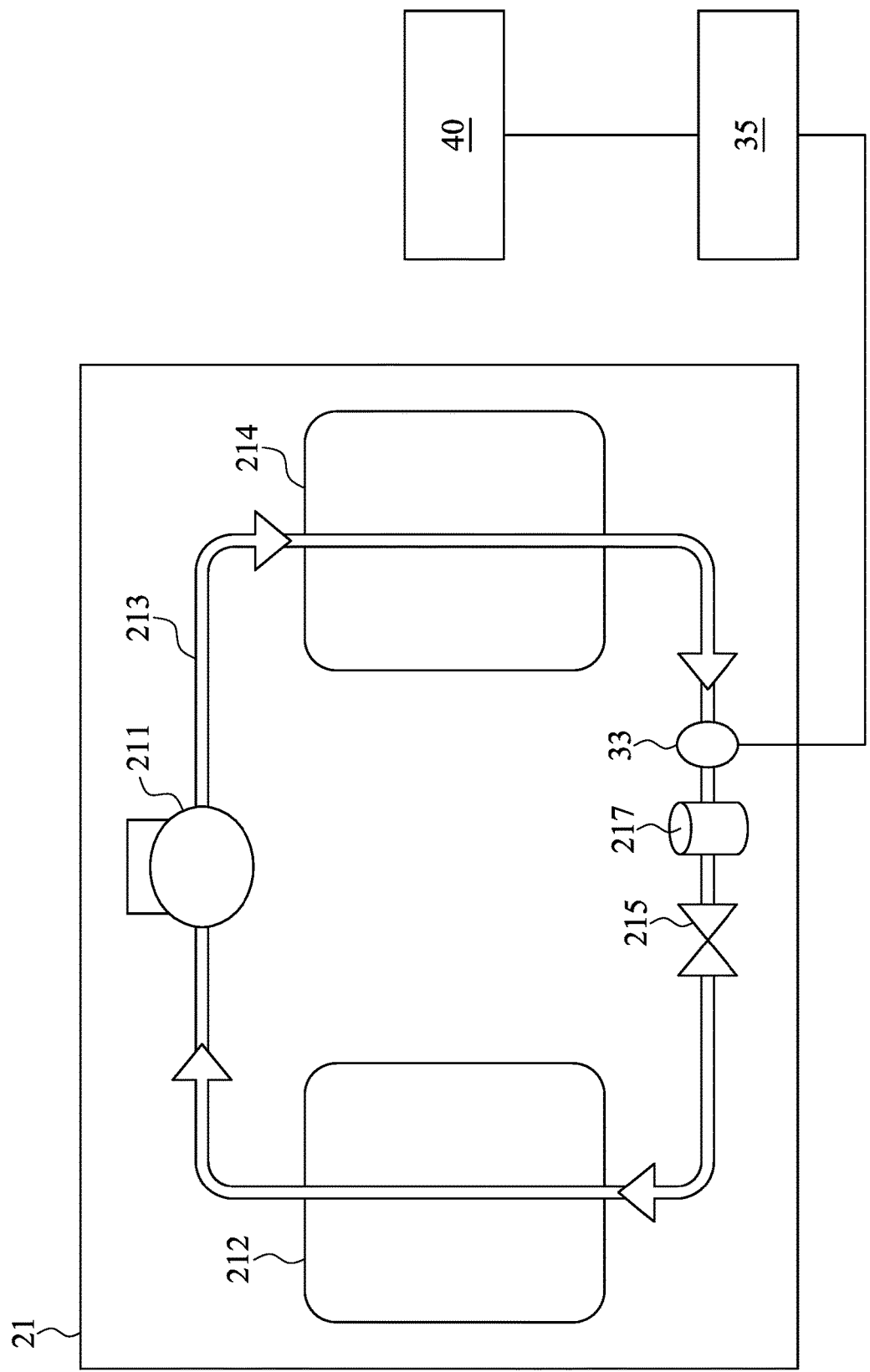
FIG. 3 is a schematic view of a temperature and humidity controller in accordance with some embodiments of the present disclosure.

FIG. 3 is a schematic view of a temperature and humidity controller in accordance with some embodiments of the present disclosure. In some embodiments of the present disclosure, the conditioner 20 includes a temperature and humidity controller 21, and the temperature and humidity controller 21 includes a compressor 211, an evaporator 212, a refrigerant pipeline 213 with refrigerant, a condenser 214, an expansion valve 215 and a drier 217. The temperature and humidity controller 21 may be comprised of two sides; the high-pressure side and the low-pressure side. Each of the parts within must be in good working order to effectively transfer gas/liquid from the high-pressure side to the low-pressure side, and back again.

The compressor 211 is configured to transport the refrigerant at the required pressure through the temperature and humidity controller 21. The refrigerant is a low pressure gas as it enters the compressor 211 from the evaporator 212. The compressor 211 increases the refrigerant pressure and also its temperature so it becomes a high pressure gas which, in turn, helps the refrigerant condense more rapidly in the next component, which is the condenser 214.

The condenser 214 works in the opposite way to the evaporator 212. The heat of the refrigerant, which is generated by the compressor 211, is removed while the refrigerant passes through the condenser 214. Thus, the refrigerant converts from gas to liquid. That is, the condenser 214 absorbs the heat from the hot refrigerant. Then, it converts the high-pressure gas into the high-pressure liquid refrigerant.

The drier 217 is fitted on the high pressure liquid line of the temperature and humidity controller 21 between the condenser 214 and the expansion valve. The drier 217 may also include a filter and a desiccant. The liquid refrigerant moves onto the drier 217. The drier 217 filters out the impurities and removes the moisture from the refrigerant. The drier 217 may also serve as a temporary storage tank for the liquid refrigerant.

The expansion valve 215 separates the high-pressure side of the temperature and humidity controller 21 from the low-pressure side of the temperature and humidity controller 21. The high-pressure liquid refrigerant then flows to the expansion valve 217. As the refrigerant passes through the expansion valve 217 it becomes low temperature, low-pressure liquid, and vapor. The expansion valve 217 may spray the refrigerant into the evaporator 212 in the mist form. The expansion valve 217 controls the amount of refrigerant entering the evaporator 212.

The low-pressure liquid refrigerant immediately starts to boil and vaporizes as it enters the evaporator 212. As the liquid refrigerant starts to boil, the evaporator 212 absorbs the heat passing over its tubes and fins. The compressor 211, on its suction side, removes the low pressure vaporized refrigerant from the evaporator 212 and the cycle starts all over again.

In some embodiments of the present disclosure, a sensor 33 is arranged on the refrigerant pipeline 213 and between the condenser 214 and the drier 217. The sensor 33 may be adjacent to the drier 217. In some embodiments of the present disclosure, the sensor 33 includes an ultrasonic flowmeter. The sensor 33 is configured to sense or detect the flow of the refrigerant in the refrigerant pipeline 213. Thus, the user can learn the variation of the refrigerant flow in the refrigerant pipeline 213 and find whether the refrigerant within the refrigerant pipeline 213 is lost by the sensor 33.

In some embodiments of the present disclosure, an Analog-to-Digital Converter 35 connects to the sensor 33. The analog-to-Digital Converter 35 is configured to convert an analog signal to a digital signal. The data/information provided by the sensor 33 may be an analog signal. The Analog-to-Digital Converter 35 receives the analog signal from the sensor 33 and converts the analog signal to the digital signal, and then transfer the digital signal to the processor 40. In some embodiments of the present disclosure, the processor 40 directly provides the data/information from the Analog-to-Digital Converter 35. In some embodiments of the present disclosure, the processor 40 may analyze the data/information from the Analog-to-Digital Converter 35 and provides the result of analysis for the user's reference.

Figure 4:
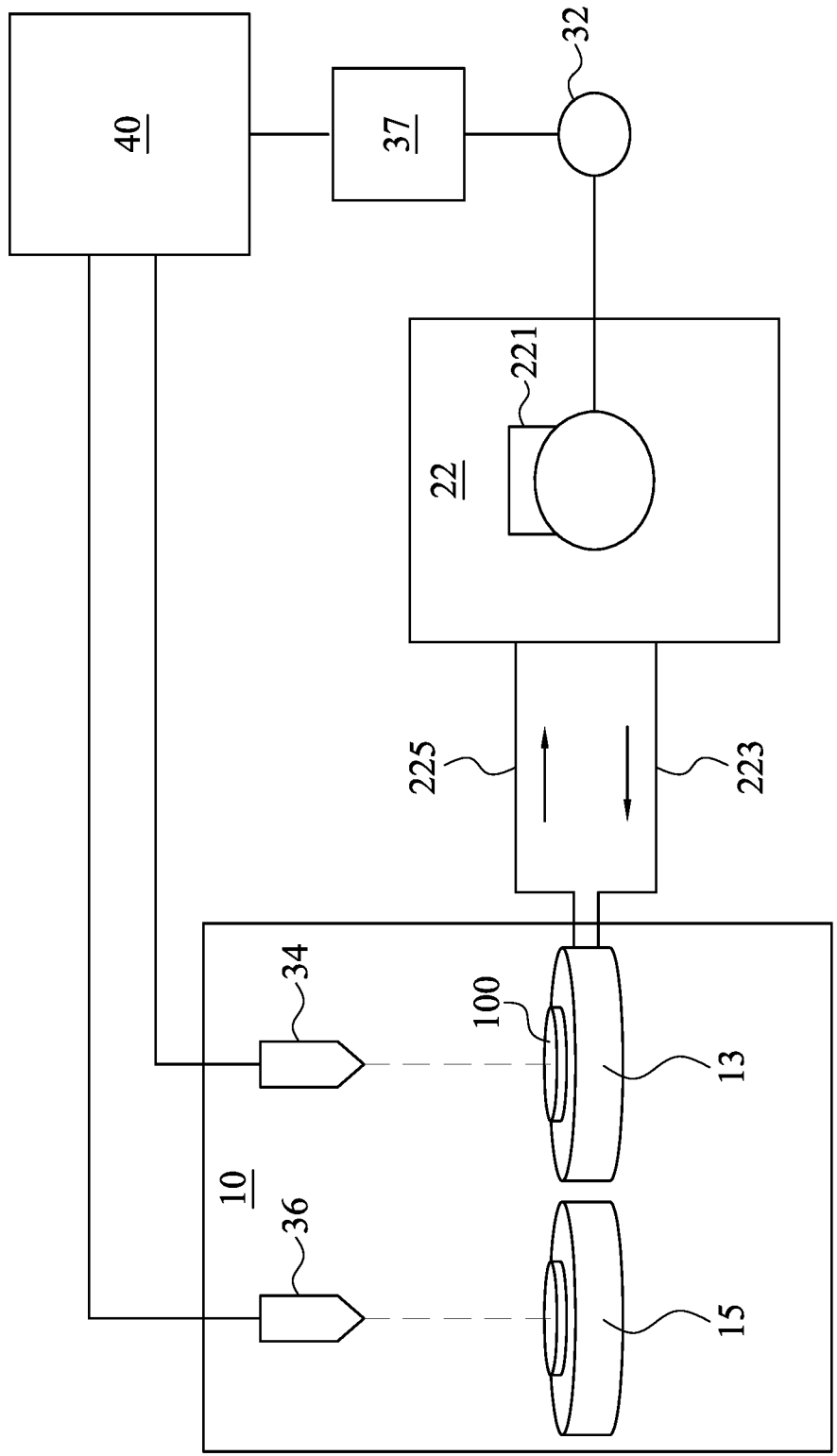
FIG. 4 is a schematic view of a chiller in accordance with some embodiments of the present disclosure.

FIG. 4 is a schematic view of a chiller in accordance with some embodiments of the present disclosure. In some embodiments of the present disclosure, the conditioner 20 includes a chiller 22. The chiller 22 may provide a cooling fluid to the semiconductor device manufacturing apparatus 10. The chiller 22 may supply cooling fluid, such as cooling water, to the semiconductor device manufacturing apparatus 10 and circulate through the interior of the semiconductor device manufacturing apparatus 10. That is, the cooling fluid is led to the semiconductor device manufacturing apparatus 10 from a cooling-fluid supply line through which the cooling fluid flows, and the cooling fluid which is warmed by absorbing heat from the semiconductor device manufacturing apparatus 10 is returned to a cooling-fluid recovery line. The cooling fluid which returned to the cooling-fluid recovery line is again supplied to a cooling-fluid supply line, after being cooled by the chiller 22. The chiller 22 includes a compressor 221 which may perform a similar function as the compressor 211 of the temperature and humidity controller 21. In some embodiments of the present disclosure, a sensor 32 connects to the compressor 221 of the chiller 22. The sensor 32 is configured to detect the compressor 221 of the chiller 21. The sensor 32 may detect the pressure of the compressor 221. Thus, the user can find whether the compressor 221 of the chiller 22 works normally by the sensor 32.

In some embodiments of the present disclosure, an Analog-to-Digital Converter 37 connects to the sensor 32. The analog-to-Digital Converter 37 is configured to convert an analog signal to a digital signal. The data/information provided by the sensor 32 may be an analog signal. The Analog-to-Digital Converter 37 receives the analog signal from the sensor 32 and converts the analog signal to the digital signal, and then transfer the digital signal to the processor 40. In some embodiments of the present disclosure, the processor 40 directly provides the data/information from the Analog-to-Digital Converter 37. In some embodiments of the present disclosure, the processor 40 may analyze the data/information from the Analog-to-Digital Converter 37 and provides the result of analysis for the user's reference.

Referring to FIG. 4, in some embodiments of the present disclosure, the chiller 22 may include a cooling-fluid supply line 233 and a cooling-fluid recovery line 225 connecting to a cold plate 13 within the semiconductor device manufacturing apparatus 10. The cold plate 13 is configured to cool the workpiece 100. The chiller 22 may supply cooling fluid into the cold plate 13 through the cooling-fluid supply line 233. When the cooling fluid passes through the cold plate 13, the cooling fluid absorbs the heat from the workpiece 100 on the cold plate 13 and thus the workpiece 100 is cooled down. After the cooling fluid is warmed by absorbing the heat from the workpiece 100 on the cold plate 13, the cooling fluid is returned to the chiller 22 through the cooling-fluid recovery line 225. Further, the cooling fluid which returned to the chiller 22 through the cooling-fluid recovery line 225 is again supplied to the cooling-fluid supply line 223, after being cooled by the chiller 22.

Moreover, the semiconductor device manufacturing apparatus 10 may further include a hot plate 15, and the workpiece 100 may be arranged on the hot plate 15.

In some embodiments of the present disclosure, a sensor 34 is arranged in the semiconductor device manufacturing apparatus 10 and configured to detect the temperature of the workpiece 100 on the cold plate 13. In some embodiments of the present disclosure, the sensor 34 includes an infrared thermometer. The sensor 34 may transfer the temperature data to the processor 40. In some embodiments of the present disclosure, a sensor 36 is arranged in the semiconductor device manufacturing apparatus 10 and configured to detect the temperature of the workpiece 100 on the hot plate 15. In some embodiments of the present disclosure, the sensor 36 includes an infrared thermometer. The sensor 36 may transfer the temperature data to the processor 40. In some embodiments of the present disclosure, the processor 40 directly provides the temperature data from the sensors 34 and/or 36. In some embodiments of the present disclosure, the processor 40 may analyze the temperature data from the sensors 34 and/or 36 and provides the result of analysis for the user's reference. In some embodiments of the present disclosure, the processor 40 may analyze the cooling rate of the workpiece 100 on the cold plate 13 based on the temperature data detected by the sensors 34. In some embodiments of the present disclosure, the processor 40 may analyze the temperature of the workpiece 100 on the hot plate 15 based on the temperature data detected by the sensors 36. Moreover, different types of workpiece may have different cooling rates when the workpiece is arranged on the cold plate, and different types of the workpiece may have different temperatures when the workpiece is arranged on the hot plate. Thus, the processor 40 may consider the different types of workpiece when analyzing the temperature data detected by the sensors 34 and 36.

Figure 5:
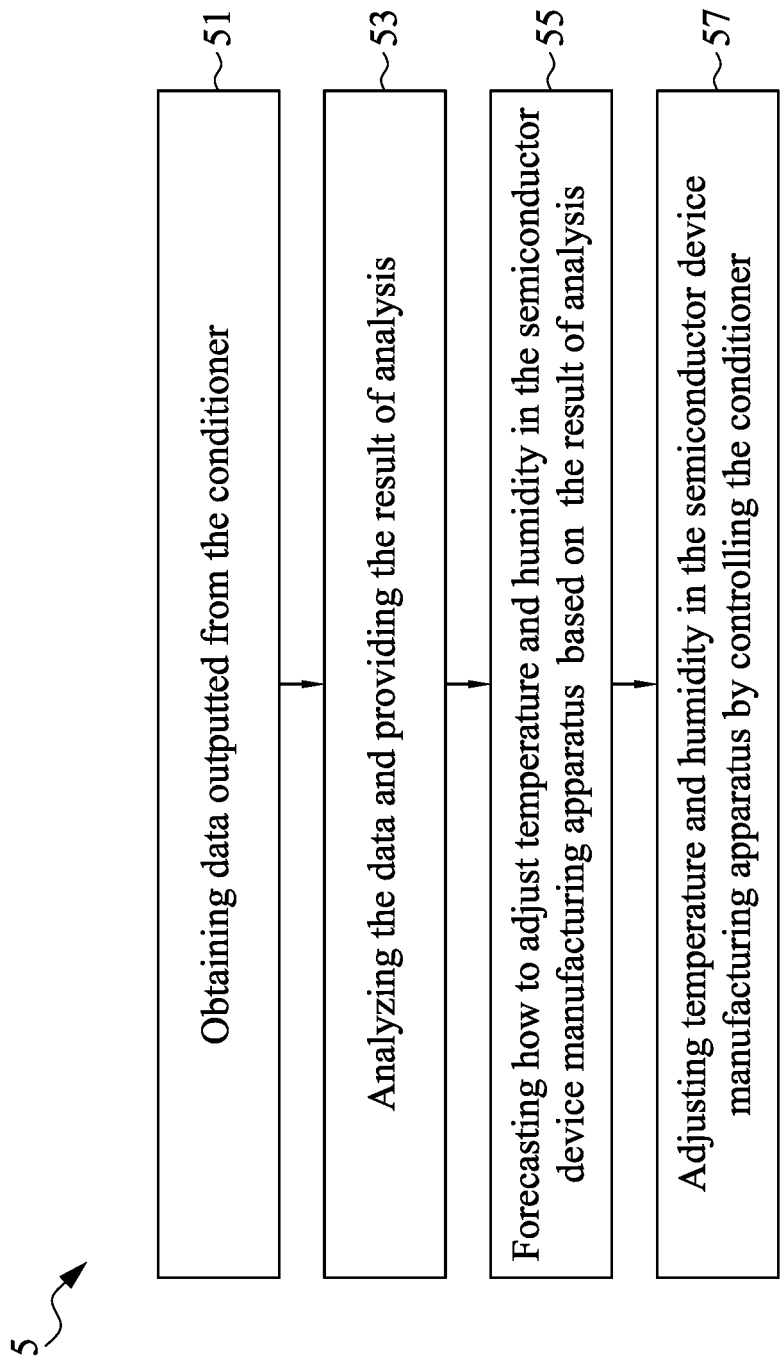
FIG. 5 is a flow chart representing exemplary operations of the method for manufacturing a semiconductor device by the semiconductor device manufacturing system, in accordance with some embodiments of the present disclosure.

FIG. 5 is a flow chart representing exemplary operations of the method for manufacturing a semiconductor device by the semiconductor device manufacturing system, in accordance with some embodiments of the present disclosure. The method 5 as shown in FIG. 5 is related to monitoring and adjusting the temperature and/or humidity in the semiconductor device manufacturing apparatus 10 based on the data/information directly outputted from the conditioner 20.

The method 5 begins at operation 51 by obtaining the data from the conditioner 2 by the serial device 31. As shown in FIG. 2, the conditioner 20 may include a temperature and humidity controller 21 and a chiller 22. Further, the temperature and humidity controller 21 may monitor itself and provide and output data and/or information related to the operations of its inner parts and the chiller may monitor itself and provide and output data and/or information related to the operations of its inner parts as well. The serial device 31 may receive the data/information directly outputted from the temperature and humidity controller 21 and the chiller 22 and transfer the data/information to the processor 40.

At operation 53, the processor 40 may analyze the data/information outputted from the temperature and humidity controller 21 and the chiller 22 and transferred by the serial device 31. Further, the processor 40 may provide the result of analysis of the data.

At operation 55, based on the result of analysis, the processor 40 may monitor whether the temperature and the humidity in the semiconductor device manufacturing apparatus 10 are maintained within an appropriate range and forecast how to adjust the temperature and the humidity in the semiconductor device manufacturing apparatus 10. That is, if the processor 40 finds that the temperature and the humidity in the semiconductor device manufacturing apparatus 10 may not be maintained within an appropriate range through the result of analysis of the data, the processor 40 may alert the user to adjust the temperature and the humidity in the semiconductor device manufacturing apparatus 10 and/or may provide a control instruction of the conditioner 2 based on the result of analysis of the data.

At operation 57, the user may control the conditioner 2 to maintain the temperature and the humidity in the semiconductor device manufacturing apparatus 10 within an appropriate range based on the instruction provided by the processor 40. Thus, the semiconductor device manufacturing system 1 may monitor the variations of the temperature and the humidity in the semiconductor device manufacturing apparatus 10 by collecting and analyzing the data/information directly outputted from the conditioner 2. Further, the semiconductor device manufacturing system 1 may instruct the user to adjust the temperature and/or humidity in the semiconductor device manufacturing apparatus 10 so as to avoid that the semiconductor device manufacturing apparatus 10 shuts down and/or the workpiece in the semiconductor device manufacturing apparatus 10 fails due to the inappropriate temperature and/or humidity.

Figure 6:
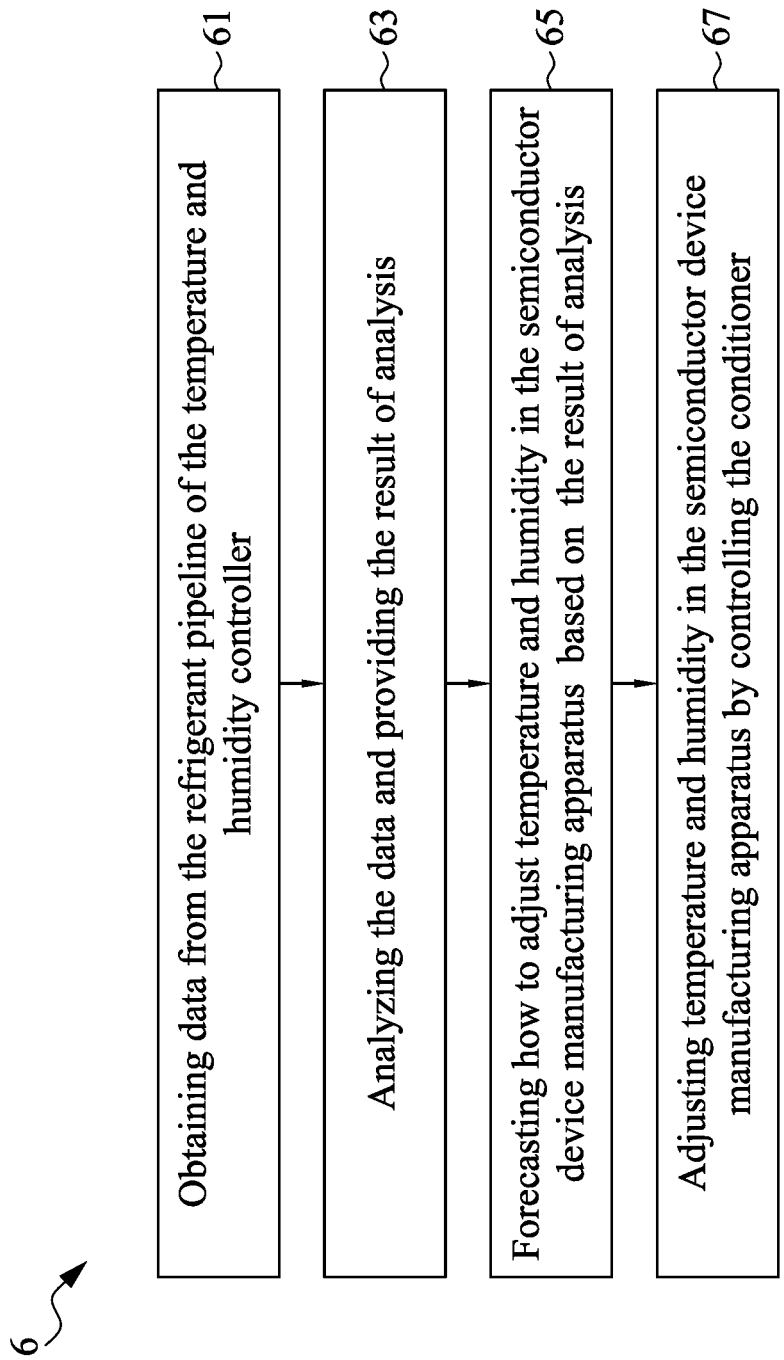
FIG. 6 is a flow chart representing exemplary operations of the method for manufacturing a semiconductor device by the semiconductor device manufacturing system, in accordance with some embodiments of the present disclosure.

FIG. 6 is a flow chart representing exemplary operations of the method for manufacturing a semiconductor device by the semiconductor device manufacturing system, in accordance with some embodiments of the present disclosure. The method 6 as shown in FIG. 6 is related to monitoring and adjusting the temperature and/or humidity in the semiconductor device manufacturing apparatus 10 based on the data/information from the refrigerant pipeline 213 of the temperature and humidity controller 21.

The method 6 begins at operation 61 by obtaining the data from the refrigerant flow in the refrigerant pipeline 213 by the sensor 33. As shown in FIG. 3, the sensor 33 is mounted on the refrigerant pipeline 213 of the temperature and humidity controller 21 and configured to detect the refrigerant flow in the refrigerant pipeline 213. The sensor 33 may transfer the data/information detected from the refrigerant pipeline 213 to the processor 40.

At operation 63, the processor 40 may analyze the data/information detected from the refrigerant pipeline 213 of the temperature and humidity controller 21. In some embodiments of the present disclosure, the processor 40 analyzes the variations of the refrigerant flow in the refrigerant pipeline 213 based on the data/information transmitted from the sensor 33. Further, the processor 40 may provide the result of analysis of the data.

At operation 65, based on the result of analysis, the processor 40 may monitor whether the temperature and the humidity in the semiconductor device manufacturing apparatus 10 are maintained within an appropriate range and forecast how to adjust the temperature and the humidity in the semiconductor device manufacturing apparatus 10. That is, if the processor 40 finds that the temperature and the humidity in the semiconductor device manufacturing apparatus 10 may not be maintained within an appropriate range through the result of analysis of the data, the processor 40 may alert the user to adjust the temperature and the humidity in the semiconductor device manufacturing apparatus 10 and/or may provide a control instruction of the conditioner 2 based on the result of analysis of the data.

At operation 67, the user may control the conditioner 2 to maintain the temperature and the humidity in the semiconductor device manufacturing apparatus 10 within an appropriate range based on the instruction provided by the processor 40. Thus, the semiconductor device manufacturing system 1 may monitor the variations of the temperature and the humidity in the semiconductor device manufacturing apparatus 10 by collecting and analyzing the data/information related to the refrigerant flow the refrigerant pipeline 213 of the temperature and humidity controller 21. Further, the semiconductor device manufacturing system 1 may instruct the user to adjust the temperature and/or humidity in the semiconductor device manufacturing apparatus 10 so as to avoid that the semiconductor device manufacturing apparatus 10 shuts down and/or the workpiece in the semiconductor device manufacturing apparatus 10 fails due to the inappropriate temperature and/or humidity.

Figure 7:
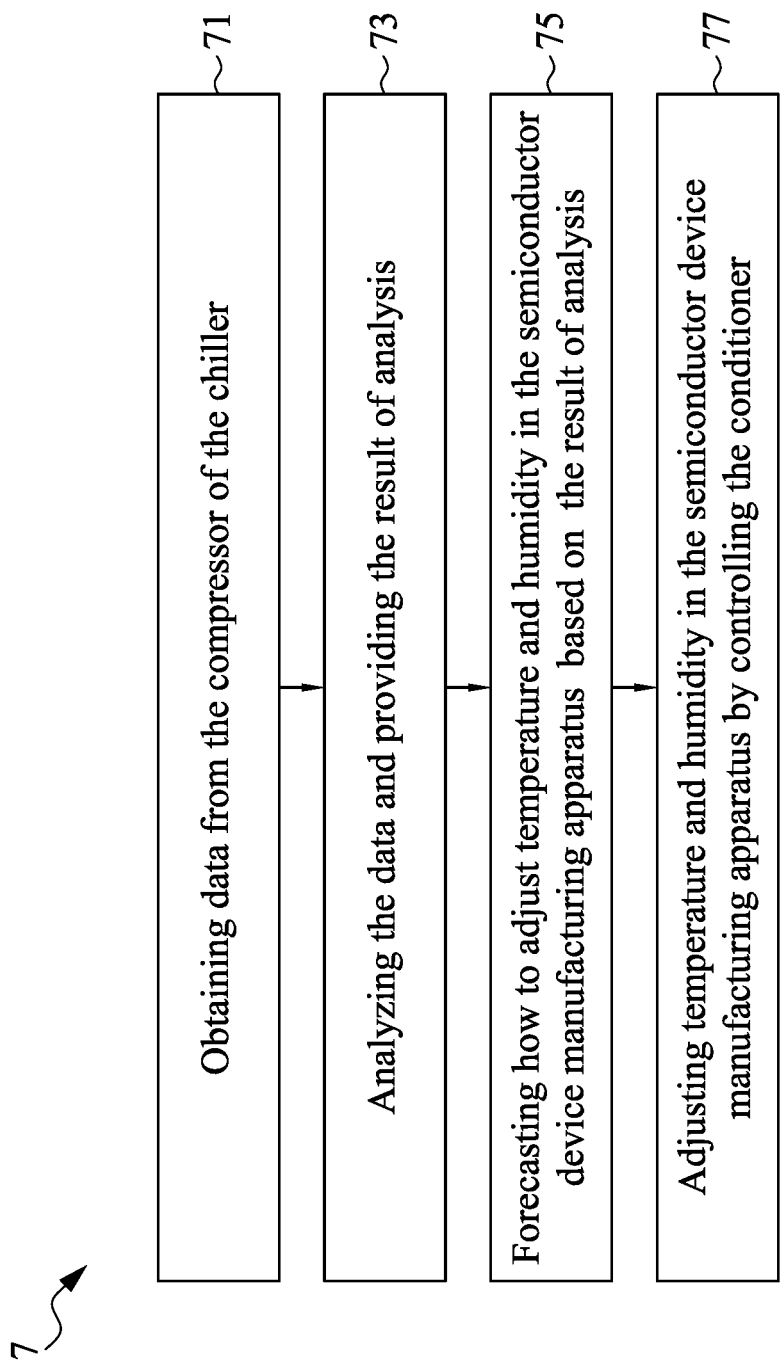
FIG. 7 is a flow chart representing exemplary operations of the method for manufacturing a semiconductor device by the semiconductor device manufacturing system, in accordance with some embodiments of the present disclosure.

FIG. 7 is a flow chart representing exemplary operations of the method for manufacturing a semiconductor device by the semiconductor device manufacturing system, in accordance with some embodiments of the present disclosure. The method 7 as shown in FIG. 7 is related to monitoring and adjusting the temperature and/or humidity in the semiconductor device manufacturing apparatus 10 based on the data/information detected from the compressor 221 of the chiller 22.

The method 7 begins at operation 71 by obtaining the data from the compressor 221 of the chiller 22 by the sensor 32. As shown in FIG. 4, the sensor 32 connects the compressor 221 of the chiller 22 and configured to detect the pressure of the compressor 221. The sensor 32 may transfer the data/information detected from the compressor 221 to the processor 40.

At operation 73, the processor 40 may analyze the data/information detected from the compressor 221 of the chiller 22. In some embodiments of the present disclosure, the processor 40 analyzes the variations of the pressure of the compressor 221 based on the data/information transmitted form the sensor 32. Further, the processor 40 may provide the result of analysis of the data.

At operation 75, based on the result of analysis, the processor 40 may monitor whether the temperature and the humidity in the semiconductor device manufacturing apparatus 10 are maintained within an appropriate range and forecast how to adjust the temperature and the humidity in the semiconductor device manufacturing apparatus 10. That is, if the processor 40 finds that the temperature and the humidity in the semiconductor device manufacturing apparatus 10 may not be maintained within an appropriate range through the result of analysis of the data, the processor 40 may alert the user to adjust the temperature and the humidity in the semiconductor device manufacturing apparatus 10 and/or may provide a control instruction of the conditioner 2 based on the result of analysis of the data.

At operation 77, the user may control the conditioner 2 to maintain the temperature and the humidity in the semiconductor device manufacturing apparatus 10 within an appropriate range based on the instruction provided by the processor 40. Thus, the semiconductor device manufacturing system 1 may monitor the variations of the temperature and the humidity in the semiconductor device manufacturing apparatus 10 by collecting and analyzing the data/information related to the pressure of the compressor 221 of the chiller 22. Further, the semiconductor device manufacturing system 1 may instruct the user to adjust the temperature and/or humidity in the semiconductor device manufacturing apparatus 10 so as to avoid that the semiconductor device manufacturing apparatus 10 shuts down and/or the workpiece in the semiconductor device manufacturing apparatus 10 fails due to the inappropriate temperature and/or humidity.

Figure 8:
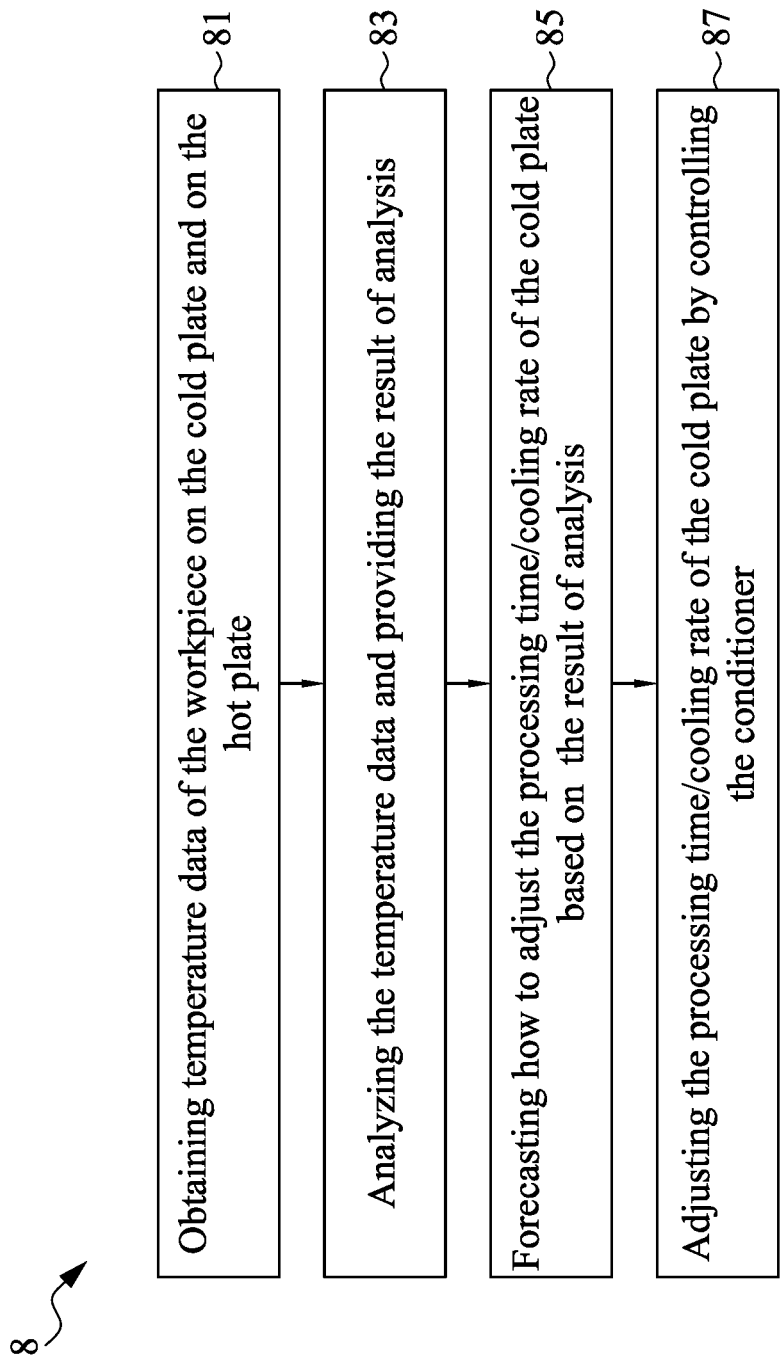
FIG. 8 is a flow chart representing exemplary operations of the method for manufacturing a semiconductor device by the semiconductor device manufacturing system, in accordance with some embodiments of the present disclosure.

FIG. 8 is a flow chart representing exemplary operations of the method for manufacturing a semiconductor device by the semiconductor device manufacturing system, in accordance with some embodiments of the present disclosure. The method 7 as shown in FIG. 8 is related to monitoring and adjusting the cooling process of the workpiece 100 in the semiconductor device manufacturing apparatus 10 based on the temperature data detected from the workpiece 100 on the cold plate 13 and the hot plate 15 of the semiconductor device manufacturing apparatus 10.

The method 8 begins at operation 81 by obtaining the temperature data from the workpiece 100 on the cold plate 13 and the hot plate 15 of the semiconductor device manufacturing apparatus 10. As shown in FIG. 4, the sensor 34 is arranged above the workpiece 100 on the cold plate 13 and configured to detect the temperature of the workpiece 100 on the cold plate 13 and the sensor 36 is arranged above the workpiece 100 on the hot plate 15 and configured to detect the temperature of the workpiece 100 on the hot plate 15. The sensors 34 and 36 may transfer the temperature data to the processor 40.

At operation 83, the processor 40 may analyze the data/information detected from the workpiece 100 on the cold plate 13 and on the hot plate 15. In some embodiments of the present disclosure, the processor 40 analyzes the cooling rate of the workpiece 100 based on the data/information transmitted from the sensor 34 and the temperature of the workpiece 100 based on the data/information transmitted from the sensor 36. Further, the processor 40 may provide the result of analysis of the data.

At operation 85, based on the result of analysis, the processor 40 may monitor the cooling process of the workpiece 100 in the semiconductor device manufacturing apparatus 10 and forecast how to adjust processing time and/or the cooling rate of the cold plate 13 of the semiconductor device manufacturing apparatus 10. That is, the processor 40 may monitor the cooling process of the workpiece 100 and instruct the user to control the conditioner to adjust the processing time of the cold plate 13 and/or the cooling rate of the cold plate 13.

At operation 87, the user may control the conditioner 2 to adjust the processing time of the cold plate 13 and/or the cooling rate of the cold plate 13. Thus, the semiconductor device manufacturing system 1 may monitor the cooling process of the workpiece 100 in the semiconductor device manufacturing apparatus 10 by collecting and analyzing the data/information related to the temperature and/or the cooling rate of the workpiece 100 on the cold plate 13 and the hot plate 15. Further, the semiconductor device manufacturing system 1 may instruct the user to adjust the processing time of the cold plate 13 and/or the cooling rate of the cold plate 13 so as to improve the quality of the workpiece in the semiconductor device manufacturing apparatus 10.

In some embodiments of the present disclosure, the semiconductor device manufacturing system 1 may monitor the variations of the temperature and the humidity in the semiconductor device manufacturing apparatus 10 by collecting and analyzing two or more data/information transferred from the serial device 31 and the sensor 32, 33 and 34. In other words, the processor 40 may receive and analyze two or more data/information transferred from the serial device 31 and the sensor 32, 33 and 34 and provide a control instruction of the conditioner 2 based on the result of analysis of two or more data.

Figure 9:
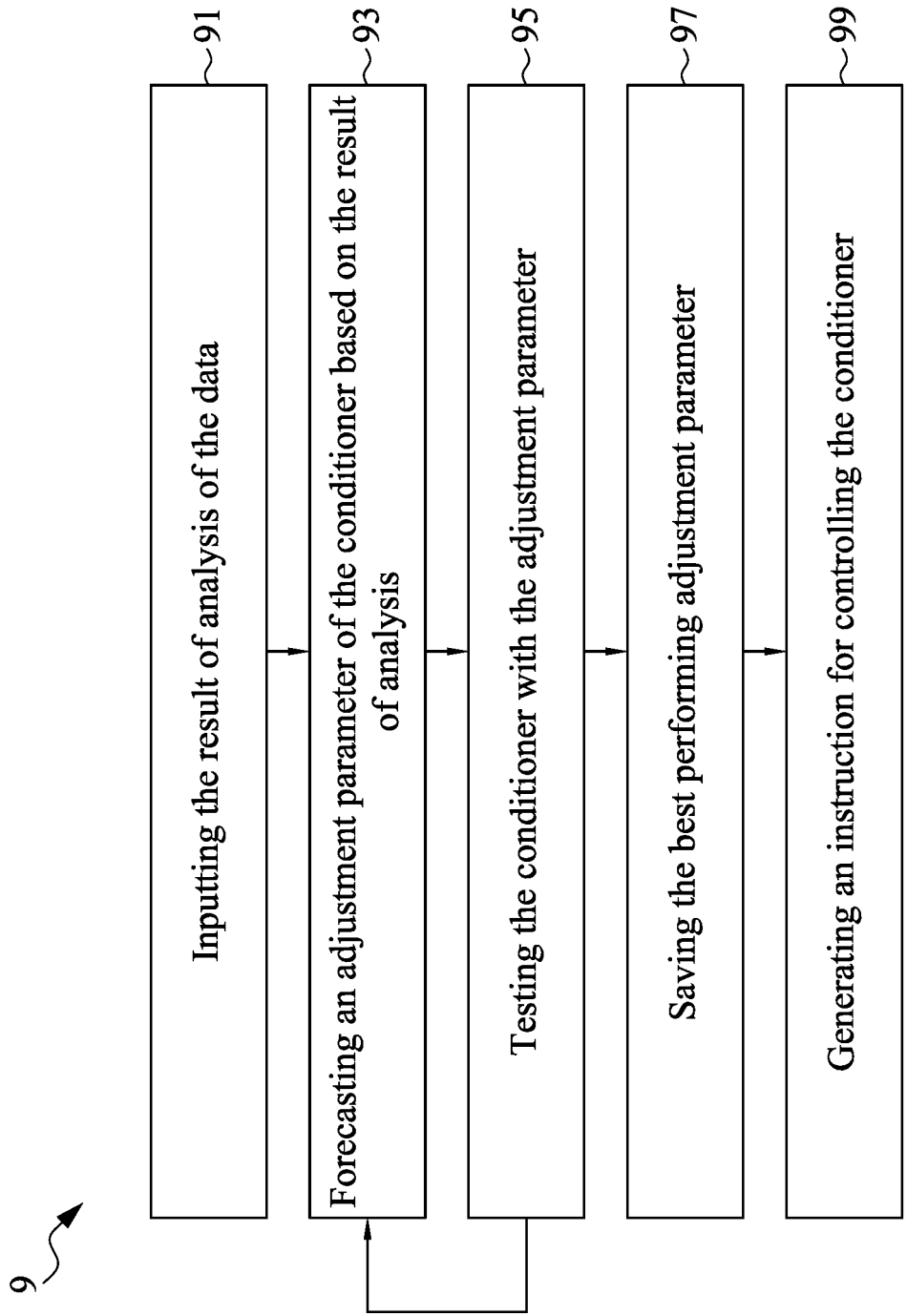
FIG. 9 is a flow chart representing exemplary operations for the method for generating an instruction for controlling the conditioner, in accordance with some embodiments of the present disclosure.

FIG. 9 is a flow chart representing exemplary operations for the method for generating an instruction for controlling the conditioner.

The method 9 is related to forecasting how to adjust temperature and humidity in the semiconductor device manufacturing apparatus 10 as specified in the operations 55, 65 and 75 and/or forecasting how to adjust the processing time of the cold plate 13 as specified in the operation 85. In some embodiments of the present disclosure, the processor 40 includes a building unit which is configured to generate the instruction for controlling the conditioner 2 based on the data received by the processor 40. Thus, the processor 40 may include big data analytics, deep learning, machine learning, neuro network, etc. At operation 91, the data received by the processor 40 and/or the data result analyzed by the processor 40 are inputted into the building unit.

At operation 93, the building unit may forecast and provide an adjustment parameter of the conditioner 2 based on the inputted data and/or the result of analysis.

At Operation 95, the conditioner 2 is operated with the adjustment parameter forecasted by the building unit of the processor 40. If the conditioner 2 with the adjustment parameter forecasted by the building unit of the processor 40 can maintain or adjust the temperature and/or humidity in the semiconductor device manufacturing apparatus 10 within the appropriate range, the adjustment parameter will be saved. However, if the conditioner 2 with the adjustment parameter forecasted by the building unit of the processor 40 cannot maintain or adjust the temperature and/or humidity in the semiconductor device manufacturing apparatus 10 within the appropriate range, the adjustment parameter will be withdrawn and the building unit of the processor 40 will forecast and provide a new adjustment parameter for testing. In other words, there can be a loop between the operation 94 and the operation 95. At operation 97, the best performing adjustment parameters, which can control the conditioner 2 to maintain or adjust the temperature and/or humidity in the semiconductor device manufacturing apparatus 10 within the appropriate range, will be saved.

At operation 99, for generating an instruction for controlling the conditioner 2, the mentioned best performing adjustment parameters saved in the operation 97 are reloaded and used.

It will be further appreciated that the foregoing system may be used for maintaining temperature and/or humidity in the semiconductor device manufacturing apparatus within an appropriate range.

According to one embodiment of the present disclosure, a semiconductor device manufacturing system comprises a conditioner connected to a semiconductor device manufacturing apparatus, a data collector connected to the conditioner and a processor connected to the data collector. The conditioner is configured to control a temperature and a humidity of an air and deliver the air to the semiconductor device manufacturing apparatus. The data collector is configured to collect data from the conditioner. The processor is configured to receive the data transferred from the data collector.

According to another embodiment of the present disclosure, a semiconductor device manufacturing system comprises a chiller connected to a semiconductor device manufacturing apparatus, a sensor arranged within the semiconductor device manufacturing apparatus and a processor connected to the sensor. The chiller is configured to provide a cooling fluid to a cold plate of the semiconductor device manufacturing apparatus. The sensor is configured to collect temperature data of a workpiece on the cold plate and on a hot plate of the semiconductor device manufacturing apparatus. The processor is configured to receive the temperature data transferred from the sensor.

According to one embodiment of the present disclosure, a method of manufacturing a semiconductor device, comprising: obtaining data or information from a conditioner by a data collector, wherein the conditioner is configured to control temperature and humidity in a semiconductor device manufacturing apparatus; transferring the data or information from the data collector to a processor, and analyzing the data or information by the processor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device manufacturing system, comprising:
    a conditioner connected to a semiconductor device manufacturing apparatus and configured to control a first temperature and a humidity of an air and deliver the air to the semiconductor device manufacturing apparatus;
    a data collector connected to the conditioner and configured to collect first temperature data and second temperature data from the conditioner; and
    a processor connected to the data collector and configured to receive the first temperature data and second temperature data transferred from the data collector,
    wherein the first temperature data comprises a first cooling rate of a first workpiece placed on a cold plate of the semiconductor device manufacturing apparatus, and the second temperature data comprises a second temperature of a second workpiece placed on a hot plate of the semiconductor device manufacturing apparatus, and the conditioner is further configured to decrease or increase the first temperature based on the first cooling rate of the first workpiece,
    wherein the processor is further configured to forecast how to adjust processing time and a second cooling rate of the cold plate on which the first workpiece is placed based on an analysis result of the first cooling rate of the first workpiece, and the analysis result is obtained based on the first temperature data and the second temperature data,
    wherein the semiconductor device manufacturing apparatus uses the forecasted processing time and the second cooling rate of the cold plate to process the first workpiece.

2. The semiconductor device manufacturing system of claim 1, wherein the conditioner comprises a temperature and humidity controller.

3. The semiconductor device manufacturing system of claim 2, wherein the data outputted from the conditioner comprises: an air flow rate of the temperature and humidity controller, an evaporator pressure of the temperature and humidity controller, a condenser pressure of the temperature and humidity controller, a refrigerant flow rate of the temperature and humidity controller and a blower current of the temperature and humidity controller.

4. The semiconductor device manufacturing system of claim 2, wherein the conditioner comprises a chiller configured to provide a cooling fluid to the semiconductor device manufacturing apparatus and the data outputted from the conditioner comprises: an evaporator pressure of the chiller, a condenser pressure of the chiller, a refrigerant flow rate of the chiller and a pump current of the chiller.

5. The semiconductor device manufacturing system of claim 4, wherein the chiller is configured to provide the cooling fluid to a cold plate of the semiconductor device manufacturing apparatus.

6. The semiconductor device manufacturing system of claim 2, wherein the data collector comprises a serial device configured to convert binary data to decimal data.

7. The semiconductor device manufacturing system of claim 1, wherein the conditioner comprises a temperature and humidity controller and wherein the data collector comprises a first sensor configured to detect a refrigerant flow in a refrigerant pipeline of the temperature and humidity controller.

8. The semiconductor device manufacturing system of claim 7, wherein the second sensor is arranged on a refrigerant pipeline of the temperature and humidity controller and between a condenser and a drier of the temperature and humidity controller.

9. The semiconductor device manufacturing system of claim 7, wherein the first sensor comprises an ultrasonic flowmeter.

10. The semiconductor device manufacturing system of claim 7, further comprising an Analog-to-Digital Converter connected to the first sensor.

11. The semiconductor device manufacturing system of claim 1, wherein the conditioner comprises a chiller configured to provide a cooling fluid to the semiconductor device manufacturing apparatus and wherein the data collector comprises a third sensor configured to detect a compressor of the chiller.

12. The semiconductor device manufacturing system of claim 11, further comprising an Analog-to-Digital Converter connected to the third sensor.

13. A semiconductor device manufacturing system, comprising:
a chiller connected to a semiconductor device manufacturing apparatus and configured to provide a cooling fluid to a cold plate of the semiconductor device manufacturing apparatus;
a first sensor and a second sensor arranged within the semiconductor device manufacturing apparatus and configured to collect first temperature data of a first workpiece on the cold plate and second temperature data of a second workpiece on a hot plate of the semiconductor device manufacturing apparatus, respectively, wherein the first temperature data comprises cooling rates of the first workpiece; and
a processor connected to the first sensor and the second sensor and configured to receive the first temperature data and the second temperature data transferred from the first sensor and the second sensor, respectively,
wherein the processor is further configured to analyze a first cooling rate of the first workpiece and a temperature of the second workpiece respectively based on the first temperature data from the first sensor and the second temperature data from the second sensor to provide an analysis result,
wherein the processor is further configured to monitor a cooling process of the first workpiece and forecast how to adjust processing time and a second cooling rate of the cold plate based on the analysis result,
wherein the semiconductor device manufacturing apparatus uses the forecasted processing time and the second cooling rate of the cold plate to process the first workpiece.

14. The semiconductor device manufacturing system of claim 13, wherein the first sensor and the second sensor are infrared thermometers.

15. The semiconductor device manufacturing system of claim 13, further comprising an Analog-to-Digital Converter connected to the first sensor.

16. The semiconductor device manufacturing system of claim 13, further comprising a temperature and humidity controller configured to control a temperature and a humidity of an air and deliver the air to the semiconductor device manufacturing apparatus.

17. The semiconductor device manufacturing system of claim 13, further comprising a data collector connected to the chiller and configured to collect data from the chiller.

18. A method of manufacturing a semiconductor device, comprising:
providing a first workpiece and a second workpiece;
obtaining first temperature data and second temperature data, by a first sensor and a second sensor, of the first workpiece on a cold plate and the second workpiece on a hot plate of a semiconductor device manufacturing apparatus, respectively;
analyzing a first cooling rate of the first workpiece and a temperature of the second workpiece respectively based on the first temperature data from the first sensor and the second temperature data from the second sensor to provide an analysis result; and
monitoring a cooling process of the first workpiece and forecast how to adjust processing time and a second cooling rate, by a conditioner, of the cold plate based on the analysis result; and
utilizing the semiconductor device manufacturing apparatus to use the forecasted processing time and the second cooling rate of the cold plate to process the first workpiece.

19. The method of claim 18, wherein the conditioner comprises a chiller.

20. The method of claim 18, wherein the conditioner comprises a chiller configured to deliver a cooling fluid to the cold plate of the semiconductor device manufacturing apparatus.

* * * * *